United States Patent
Oyabu et al.

(10) Patent No.: US 8,426,318 B2
(45) Date of Patent: Apr. 23, 2013

(54) METHOD OF SETTING THICKNESS OF DIELECTRIC AND SUBSTRATE PROCESSING APPARATUS HAVING DIELECTRIC DISPOSED IN ELECTRODE

(75) Inventors: Jun Oyabu, Nirasaki (JP); Takashi Kitazawa, Nirasaki (JP)

(73) Assignee: Tokyo Electron Limited (JP)

( * ) Notice: Subject to any disclaimer, the term of this patent is extended or adjusted under 35 U.S.C. 154(b) by 124 days.

(21) Appl. No.: 13/171,703

(22) Filed: Jun. 29, 2011

(65) Prior Publication Data
US 2011/0318935 A1 Dec. 29, 2011

Related U.S. Application Data

(60) Provisional application No. 61/374,062, filed on Aug. 16, 2010.

(30) Foreign Application Priority Data

Jun. 29, 2010 (JP) ................................. 2010-147445

(51) Int. Cl.
*H01L 21/3065* (2006.01)
*C23F 1/08* (2006.01)
(52) U.S. Cl.
USPC ................ 438/723; 216/61; 216/71

(58) Field of Classification Search ............... 438/723; 216/71, 61
See application file for complete search history.

(56) References Cited

U.S. PATENT DOCUMENTS
7,784,426 B2 * 8/2010 Schmitt .................... 118/723 E

FOREIGN PATENT DOCUMENTS
JP 2007-505450 3/2007

* cited by examiner

*Primary Examiner* — Roberts Culbert
(74) *Attorney, Agent, or Firm* — Cantor Colburn LLP

(57) ABSTRACT

Provided is a method of setting a thickness of a dielectric, which restrains the dielectric formed in an electrode from being consumed when etching a silicon dioxide film on a substrate by using plasma. In a substrate processing apparatus including an upper electrode facing a susceptor and the dielectric formed of silicon dioxide in the upper electrode, a silicon dioxide film formed on a wafer being etched by using plasma, an electric potential of the plasma facing the dielectric in a case where the dielectric is not formed in the upper electrode is estimated based on a bias power applied to the susceptor and an A/C ratio in a chamber, and the thickness of the dielectric is determined so that an electric potential of the plasma, which is obtained by multiplying the estimated electric potential of the plasma by a capacity reduction coefficient calculated when a capacity of the dielectric and a capacity of a sheath generated around a surface of the dielectric are combined, is 100 eV or less.

4 Claims, 3 Drawing Sheets (A)

SHEATH (B)

METHOD OF SETTING THICKNESS OF DIELECTRIC AND SUBSTRATE PROCESSING APPARATUS HAVING DIELECTRIC DISPOSED IN ELECTRODE

CROSS-REFERENCE TO RELATED PATENT APPLICATIONS

This application claims the benefit of Japanese Patent Application No. 2010-147445 filed on Jun. 29, 2010, in the Japan Patent Office and U.S. Patent Application Ser. No. 61/374,062, filed on Aug. 16, 2010, in the United States Patent and trademark Office, the disclosures of which are incorporated herein in their entireties by reference.

BACKGROUND OF THE INVENTION

1. Field of the Invention

The present invention relates to a substrate processing apparatus having a dielectric disposed in an electrode so as to face a substrate, and a method of setting a thickness of the dielectric in the substrate processing apparatus.

2. Description of the Related Art

When wiring processes such as forming of holes, forming of trenches, and the like are performed on a substrate such as a semiconductor wafer, a fine process needs to be performed on the substrate, and thus, a dry etching process using plasma is being widely used.

Recently, in a method of processing a large-size substrate in which dry etching process is used, there have been studied various ways for uniformizing an etch rate throughout the entire surface of the substrate. For example, there has been suggested a method of compensating for non-uniformity of a voltage on an electrode plane by disposing a dielectric in an upper electrode in a chamber of a substrate processing apparatus including the upper electrode and a lower electrode (for example, refer to Patent Document 1). Silicon dioxide ($SiO_2$) may be suitable to be used as the dielectric in consideration of a dielectric constant or availability.

On the other hand, in order to manufacture a semiconductor device by using a semiconductor wafer (hereinafter, simply referred to as wafer) as the substrate, a plurality of plasma processes need to be performed on one wafer. Thus, performing of a plurality of plasma processes while sequentially changing processing conditions in one chamber, that is, so called one-chamber plural processes, has been required recently.

However, since the one-chamber plural processes may sometimes include an etching process of a silicon dioxide film as an insulating oxide film formed on the wafer, the processing conditions in the chamber become suitable for etching the silicon dioxide when the insulating oxide film is etched by using the plasma. Consequently, the dielectric formed in the upper electrode may be etched and consumed fast. When the dielectric is consumed fast, cycles of replacing the dielectric or the upper electrode are reduced, and thus, CoC (cost of consumable) of the substrate processing apparatus degrades.

(Patent Document 1) Japanese Unexamined Patent Application Publication (Translation of PCT Application) No. 2007-505450

SUMMARY OF THE INVENTION

To solve the above and/or other problems, the present invention provides a method of setting a thickness of a dielectric and a substrate processing apparatus capable of restraining consumption of the dielectric formed in an electrode when etching a silicon dioxide film on a substrate by using plasma.

According to an aspect of the present invention, there is provided a method of setting a thickness of a dielectric in a substrate processing apparatus including a processing chamber in which plasma is generated; a holding stage which is disposed in the processing chamber and which places a substrate thereon; an electrode facing the holding stage; and the dielectric disposed in the electrode so as to face the substrate placed on the holding stage, the dielectric being formed of silicon dioxide, and two high frequency powers of different frequencies being applied to the holding stage so as to etch a silicon dioxide film formed on the substrate by using the plasma, the method including: estimating an electric potential of the plasma facing the dielectric in a case where the dielectric is not disposed in the electrode, based on the high frequency power value having a lower frequency between the two high frequency powers, and an area ratio of an anode to a cathode in the processing chamber; and setting the thickness of the dielectric so that an electric potential of the plasma, which is obtained by multiplying the estimated electric potential of the plasma by a capacity reduction coefficient calculated when a capacity of the dielectric and a capacity of a sheath generated around a surface of the dielectric are combined, is 100 eV or less.

When the capacity reduction coefficient is calculated, the sheath and the dielectric may be considered as capacitors electrically connected to each other in series.

When the capacity reduction coefficient is calculated, the thickness of the dielectric may be converted into a thickness in a case where a dielectric constant of the dielectric is assumed as a vacuum permittivity.

When the capacity reduction coefficient is calculated, a thickness of the sheath may be calculated based on the estimated electric potential of the plasma.

According to another aspect of the present invention, there is provided a substrate processing apparatus including a processing chamber in which plasma is generated; a holding stage which is disposed in the processing chamber and places a substrate thereon; an electrode facing the holding stage; and a dielectric disposed in the electrode to face the substrate placed on the holding stage, the dielectric being formed of silicon dioxide, and two high frequency powers of different frequencies being applied to the holding stage so as to etch a silicon dioxide film formed on the substrate by using the plasma, the substrate processing apparatus including: the thickness of the dielectric is set by estimating an electric potential of the plasma facing the dielectric in a case where the dielectric is not formed in the electrode, based on the high frequency power value having a lower frequency between the two high frequency powers, and an area ratio of an anode to a cathode in the processing chamber, and by setting an electric potential of the plasma, which is obtained by multiplying the estimated electric potential of the plasma by a capacity reduction coefficient calculated when a capacity of the dielectric and a capacity of a sheath generated around a surface of the dielectric are combined, to be 100 eV or less.

BRIEF DESCRIPTION OF THE DRAWINGS

The above and other features and advantages of the present invention will become more apparent by describing in detail exemplary embodiments thereof with reference to the attached drawings in which:

FIG. 3 is a diagram illustrating a sheath and a dielectric in the substrate processing apparatus of FIG. 1, in which FIG. 3A is a diagram illustrating a location relation between the sheath and the dielectric, and FIG. 3B is an electric circuit diagram showing the sheath and the dielectric.

DETAILED DESCRIPTION OF THE INVENTION

Hereinafter, the present invention will be described in detail by explaining exemplary embodiments of the invention with reference to the attached drawings.

Figure 1:
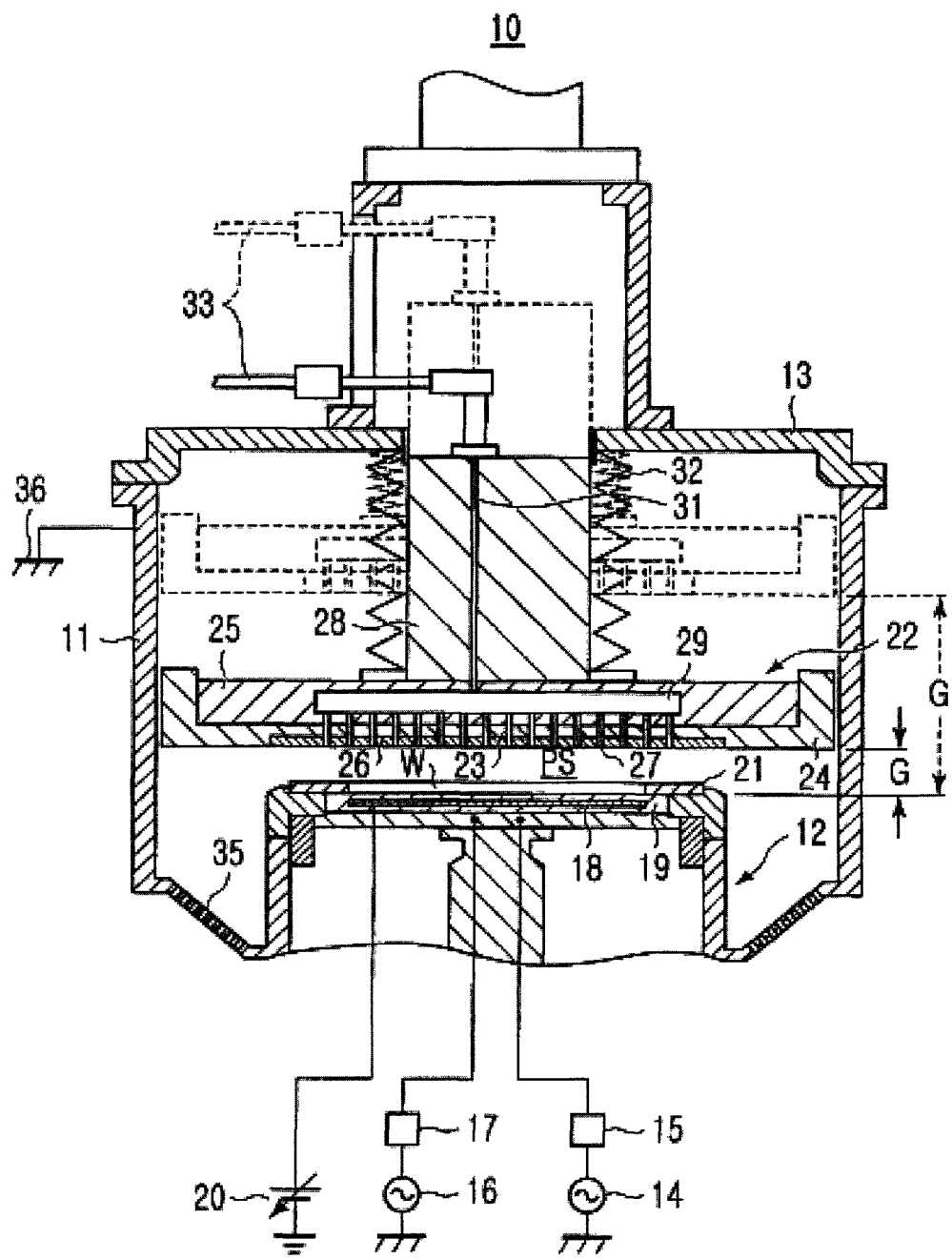
FIG. 1 is a schematic cross-sectional view of a substrate processing apparatus according to an embodiment of the present invention.

FIG. 1 is a schematic cross-sectional view showing a configuration of a substrate processing apparatus according to an embodiment of the present invention. The substrate processing apparatus performs a dry etching process on a wafer W by using plasma.

In FIG. 1, the substrate processing apparatus 10 includes a chamber 11 (processing chamber) having a cylindrical shape and receiving a wafer W having a diameter of, for example, 300 mm. A disk shaped susceptor 12 (holding stage), on which the wafer W is placed, is disposed in a lower side of the chamber 11 in the drawing, and an upper end of the chamber 11 in the drawing is covered by a disk shaped cover portion 13 that is freely opened and closed.

The inside of the chamber 11 is depressurized by TMP (turbo molecular pump) and a DP (dry pump) (both are not shown) etc., and a pressure in the chamber 11 is controlled by an APC valve (not shown).

A first high frequency power source 14 is connected to the susceptor 12 via a first matcher 15, a second high frequency power source 16 is connected to the susceptor 12 via a second matcher 17. The first high frequency power source 14 applies a bias power that is a high frequency power of a relatively low frequency, for example, 13 MHz, to the susceptor 12, and the second high frequency power source 16 applies a plasma generating power that is high frequency power of a relatively high frequency, for example, 40 MHz, to the susceptor 12. The susceptor 12 applies the plasma generating power to a processing space PS in the chamber 11.

An electrostatic chuck 19 including an electrostatic electrode plate 18 therein is disposed on an upper portion of the susceptor 12. The electrostatic chuck 19 is formed of a disk-shaped ceramic member, and a direct current (DC) power source 20 is connected to the electrostatic electrode plate 18. When a positive DC voltage is applied to the electrostatic electrode plate 18, negative electric potential is generated on a surface (hereinafter, referred to as a rear surface) of the wafer W facing the electrostatic chuck 19 so that an electric field is generated between the electrostatic electrode plate 18 and the rear surface of the wafer W, and the wafer W is attached and held by the electrostatic chuck 19 by Coulomb force or Johnson-Rahbek force caused by the electric field.

A focus ring 21 that is a ring-shaped member is placed on the susceptor 12 so as to surround the wafer W attached and held by the electrostatic chuck 19. The focus ring 21 is formed of a conductive material, for example, single-crystalline silicon that is the same material as the material used to form the wafer W. Since the focus ring 21 is formed of the conductive material, a distribution domain of the plasma may be expanded to an upper surface of the focus ring 21, as well as on the upper surface of the wafer W, and thus, plasma density on a peripheral portion of the wafer W is maintained to be the same level as plasma density on a center portion of the wafer W, and thereby contributing to maintaining of evenness in the dry etching process performed on an entire surface of the wafer W.

A shower head 22 is disposed over the susceptor 12 in the drawing so as to face the susceptor 12. The shower head 22 includes a conductive upper electrode 24 having a plurality of gas holes 23, a dielectric 26, which is formed of, for example, quartz (silicon dioxide), buried in the upper electrode 24 and exposed to face the processing space PS, a cooling plate 25 which detachably suspends and holds the upper electrode plate 24 and the dielectric 26, and a shaft 28 that is a holding member for suspending and holding the cooling plate 25. The dielectric 26 includes gas holes 27 communicating with the gas holes 23 of the upper electrode 24. In addition, the dielectric 26 is formed in a disk shape and has a diameter of $\phi 360$ mm.

The upper electrode 24 is electrically connected to a ground 36 via a bellows 32 that will be described later or the cover portion 13, and a wall portion of the chamber 11, that is, is electrically grounded, and functions as a grounding electrode of the plasma generating power that is applied to the inside of the chamber 11. An outer diameter of the upper electrode 24 is almost the same as an inner diameter of the chamber 11 so that the upper electrode 24 is disposed to fit into the chamber 11.

The shaft 28 penetrates through the cover portion 13, and an upper portion of the shaft 28 is connected to a lifting tool (not shown) disposed in an upper side of the substrate processing apparatus 10. The lifting tool moves the shaft 28 in up and down direction in the drawing, and at this time, the shower head 22 including the upper electrode 24 is moved up and down like a piston in the chamber 11. Accordingly, a gap G that is a thickness of a space between the shower head 22 and the susceptor 12 (hereinafter, simply referred to as gap G) may be adjusted. A maximum moving amount of the shower head 22 in the up and down direction in the drawing is, for example, 70 mm.

The shower head 22 includes a process gas introducing system consisting of a gas passage 31 penetrating through the shaft 28 in the up and down direction in the drawing, a buffer chamber 29, and the gas holes 23 and 27, and a gas supply pipe 33 connecting to a gas supply source (not shown) for supplying the process gas from an external source to the process gas introducing system. The bellows 32 is provided on an peripheral portion of the shaft 28 that suspends and holds the shower head 22 moving in the up and down direction, and has a concentric shape and a vacuum blocking function.

An upper end of the bellows 32 formed as a cylinder is connected to a lower surface of the cover portion 13, and a lower end of the bellows 32 is bonded to an upper surface of the cooling plate 25 of the shower head 22. Accordingly, a displacement of the electrode with respect to the cover portion 13 is absorbed by the penetration portion in which the shaft 28 penetrates through the cover portion 13, and an atmosphere around the shaft 28 and the inside of the chamber 11 are separately sealed, and thus an isolation state is maintained between the inside of the chamber 11 and the air. In FIG. 1, the shower head 22 descended to the lowermost level is indicated by a solid line, and the shower head 22 ascended to the uppermost level is indicated by a dotted line.

In the substrate processing apparatus 10 having the above-described structure, the process gas supplied from the gas supply pipe 33 to the buffer chamber 29 is introduced into the chamber 11 through the gas holes 23 of the upper electrode 24 and the gas holes 27 of the dielectric, and the process gas introduced in the chamber 11 is excited by the plasma generating power applied from the second high frequency power source 16 into the chamber 11 via the susceptor 12 to become plasma. Positive ions in the plasma are dragged to the wafer W by the bias power applied from the first high frequency power source 14 to the susceptor 12 to perform the dry etching process on the wafer W.

Operations of the components in the substrate processing apparatus 10 are controlled by a CPU of a control unit (not shown) included in the substrate processing apparatus 10 according to a program corresponding to the dry etching process.

In the above-described substrate processing apparatus 10, when performing one-chamber plural processes, the gap G is changed to realize processing conditions for each of the processes, and the one-chamber plural processes may include a process for forming a hole or a recess (trench) on an interlayer dielectric film, for example, a silicon dioxide film, formed on the wafer W by using the dry etching process. In this process, the processing conditions in the chamber 11 become suitable for the etching of silicon dioxide, and thus, there is a possibility of etching and consuming the dielectric 26 formed of quartz.

In the present embodiment, a thickness of the dielectric 26 is set to suitable value. Hereinafter, a method of setting the thickness of the dielectric according to the present embodiment will be described in detail.

In general, in order to etch a member by using plasma, an electric potential of the plasma facing the member needs to exceed a predetermined electric potential. In other words, when the electric potential of the plasma facing the member does not exceed the predetermined electric potential, the member is hardly etched by the plasma. According to various documents, it is known that the silicon dioxide forming the dielectric 26 is hardly etched by the plasma when the electric potential of the plasma facing the dielectric 26 is 100 eV or less.

On the other hand, when the plasma is generated in the processing space PS, sheath is generated around a surface of the upper electrode 24. The sheath may be considered as a capacitor between the plasma and a ground, and the electric potential of the plasma facing the upper electrode 24, more accurately, the sheath, is determined according to a capacity of the sheath. When the dielectric 26 is embedded in the upper electrode 24, the dielectric 26, as well as the sheath, also exists as the capacity between the plasma and the ground. Accordingly, the electric potential of the plasma facing the sheath is determined by a combined capacity of the sheath and the dielectric 26. In addition, since the sheath and the dielectric 26 may be considered to be electrically connected to each other in series between the plasma and the ground, the combined capacity of the sheath and the dielectric 26 may be changed by changing the thickness of the dielectric 26.

Therefore, in the present embodiment, the electric potential of the plasma facing the sheath is set to be 100 eV or less by setting the thickness of the dielectric 26 to the suitable value and changing the combined capacity of the sheath and the dielectric 26.

Hereinafter, the method of setting the thickness of the dielectric according to the present embodiment will be described in detail.

When a capacitor $C_1$ having a thickness of $d_1$, an area of an electrode S, and a dielectric constant $\in$ and a capacitor $C_2$ having a thickness of $d_2$, an area of an electrode S, and a dielectric constant $\in$ are connected to each other in series, a capacity reduction coefficient K of a combination capacitor $C_3$ is calculated using Equation 1 below.

$$K = 1/(d_1+d_2) \quad (1)$$

Here, since the capacity reduction coefficient K is also considered as a reduction coefficient of electric charges accumulated in each of the capacitors $C_1$ and $C_2$ when the capacitors $C_1$ and $C_2$ are connected to each other in series, a potential difference of the capacitor $C_1$ is also reduced according to the capacity reduction coefficient K by serially connecting the capacitor $C_2$ and the capacitor $C_1$, for example. For example, when it is assumed that the potential difference of the capacitor $C_1$ before the serial connection is $V_{pre}$ and the potential difference of the capacitor $C_1$ after the serial connection is $V_{aft}$, the potential difference $V_{aft}$ is represented by Equation 2 below.

$$V_{aft} = K \times V_{pre} \quad (2)$$

Figure 2:
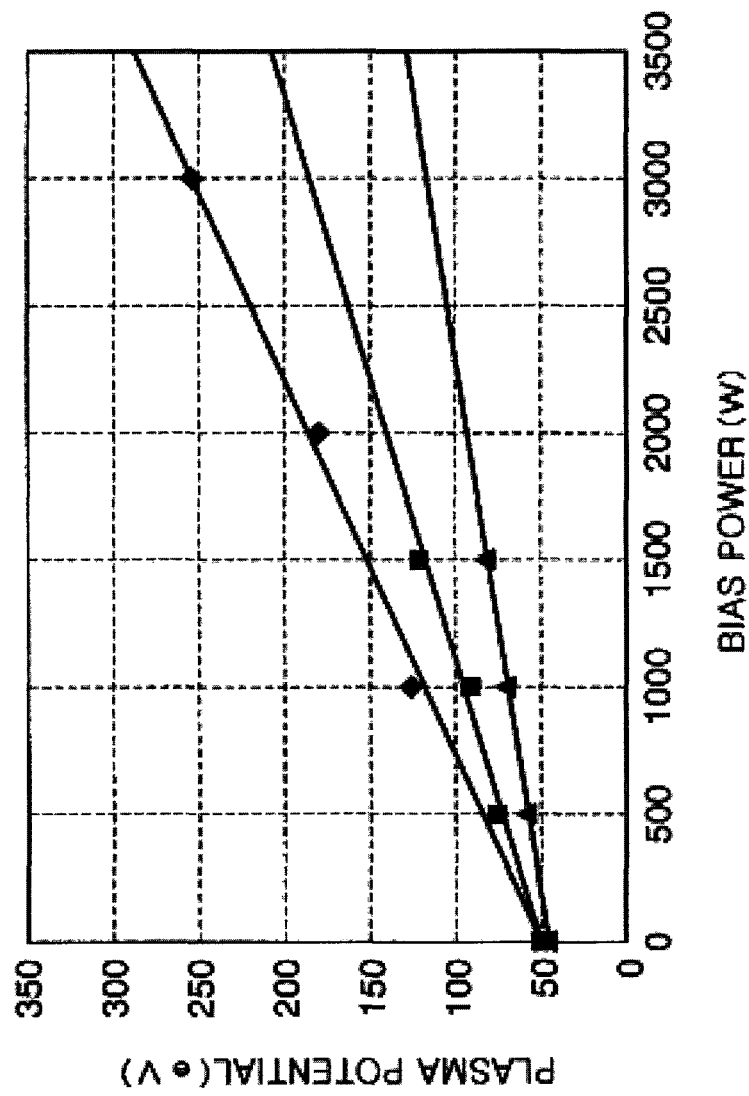
FIG. 2 is a graph showing a changing aspect of a plasma potential versus an anode/cathode ratio, a frequency of a bias power, and a bias power value in a chamber of the substrate processing apparatus shown in FIG. 1, when a dielectric is not formed.

Also, a changing aspect of the electric potential of the plasma with respect to a frequency of the bias power and a value of the bias power (more accurately, the electric potential of the plasma with respect to a wall surface of the chamber 11) varies depending on a kind of the substrate processing apparatus. In the substrate processing apparatus 10 in which the dielectric 26 cannot be disposed in the upper electrode 24, when a pressure in the chamber 11 is 30 mTorr (4.00 Pa), the plasma generating power is 1500 W, a flow rate of a mixture gas is $C_4F_6$:$C_4F_8$:Ar:$O_2$=30:15:450:50 sccm (hereinafter, referred to as processing condition A), the electric potential of the plasma is changed as shown in the graph of FIG. 2. The changing aspect of the electric potential of the plasma may also vary depending on an area ratio of an anode to a cathode in the chamber 11 (that is, an anode/cathode ratio) (hereinafter, referred to as an A/C ratio). In the graph of FIG. 2, "□" denotes data when the frequency of the bias power is 2 MHz and the A/C ratio is 6, "■" denotes data when the frequency of the bias power is 13 MHz and the A/C ratio is 4, and "▲" denotes data when the frequency of the bias power is 13 MHz and the A/C ratio is 6.

However, in the chamber 11 of the substrate processing apparatus 10, a surface of the electrostatic chuck 19 and the focus ring 21 corresponds to the cathode, and the upper electrode 24, the dielectric 26, a side wall (deposition shield) of the chamber 11, a side wall (insulator) of the susceptor 12, and a surface of an exhaust plate 35 correspond to the anode. Here, since the dielectric 26 and the sheath facing the dielectric 26 may be considered as capacitors electrically connected to each other in series in the substrate processing apparatus 10 as will be described later, an area of the dielectric 26 as the anode is the same as a result of multiplying an actual area of the dielectric 26 by the capacity reduction coefficient K. In addition, the A/C ratio in the substrate processing apparatus 10 is about 4.

When the processing condition in the substrate processing apparatus 10 is the processing condition A and the bias power is 3000 W, the electric potential of the plasma facing the sheath generated around the inner wall surface of the chamber 11 is estimated as about 200 eV from the graph of FIG. 2.

Figure 3:
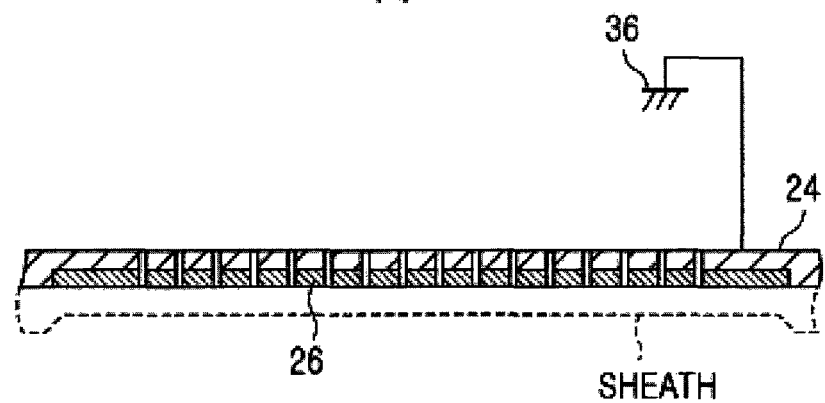
Figure 3:
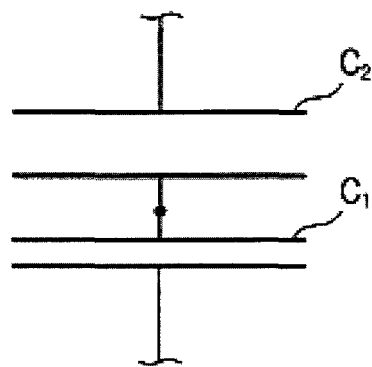

As shown in FIG. 3A, since the dielectric 26 is disposed between the sheath generated around the surface of the upper electrode 24 and the upper electrode 24 of a ground potential in the substrate processing apparatus 10, the sheath and the dielectric 26 may be considered as the capacitor $C_1$ and the capacitor $C_2$ electrically connected to each other in series (FIG. 3B). Here, the potential difference of the capacitor $C_1$ corresponding to the sheath may be calculated using Equation 2, and thus, the capacity reduction coefficient K needs to be set less than 0.50 in order to change an estimated electric potential of the plasma (200 eV) in a case where the bias power is 3000 W, to no more than the electric potential of 100 eV at which the silicon dioxide is not etched.

The thickness of the capacitor $C_1$ is a thickness of the sheath, which may be calculated from a Debye length. If the electric potential of the plasma is 200 eV, an electron temperature Te is generally 3 eV and a plasma density Ne is $10^{11}/cm^3$ under the processing condition A, and thus, a sheath thickness is about 0.97 mm from Equations 3 and 4 below.

$$\lambda D = 7.43 \times 10^3 \times (Te/Ne/10^6)^{0.5} \times 10^3 \text{ mm} \quad (3)$$

$$d = 0.606 \times \lambda D \times (2 \times Vo/Te)^{0.75} \text{ mm} \quad (4)$$

Here, $\lambda D$ is a Debye length, Vo is a plasma potential, and d is a sheath thickness.

When it is assumed that $d_{di}$ is a thickness of the capacitor $C_2$ (dielectric 26) for setting the capacity reduction coefficient K to be less than 0.50, following Equation 5 needs to be satisfied according to above Equation 1.

$$0.50 > 1/(0.97 + d_{di}) \quad (5)$$

According to the above Equation 5, the thickness $d_{di}$ of the dielectric 26 needs to satisfy Equation 6 below.

$$0.97 + d_{di} > 2 \quad (6)$$

As a result, the thickness $d_{di}$ of the dielectric 26 needs to be greater than 1.03 mm.

However, above Equation 1 has preconditions that the dielectric constant ∈ of the capacitor $C_1$ and the dielectric constant ∈ of the capacitor $C_2$ are the same as each other and the dielectric constant ∈ of the capacitor $C_2$ is a vacuum permittivity. However, since the dielectric 26 is formed of the silicon dioxide and a relative dielectric constant of the silicon dioxide is 4 when the vacuum permittivity is 1, the thickness $d_{di}$ of the dielectric 26 needs to be greater than 4.12 mm in order to set the electric potential of the plasma facing the dielectric 26 to be 100 eV or less, when the capacitor $C_2$ is formed of the silicon dioxide.

That is, in the present embodiment, the thickness $d_{di}$ of the dielectric 26 is set to be greater than 4.12 mm in order to restrain the dielectric 26 from being consumed due to etching.

According to the method of setting the thickness of the dielectric 26 of the present embodiment, in a case where the dielectric 26 formed of, for example, quartz is not formed on the upper electrode 24, the electric potential of the plasma facing the dielectric 26 is estimated. The thickness $d_{di}$ of the dielectric 26 is determined so that the electric potential of the plasma, which is obtained by multiplying the estimated electric potential of the plasma by the capacity reduction coefficient calculated when the capacity of the dielectric 26 and the capacity of the sheath generating around the surface of the dielectric 26 are electrically connected to each other in series and combined, is 100 eV or less. Therefore, when the hole or the recess (trench) is formed in the silicon dioxide film on the wafer W by the drying etching process, the consumption of dielectric 26 formed in the upper electrode 24 may be restrained.

In the present embodiment, since the electric potential of the plasma is reduced as the thickness of the dielectric 26 increases, it is preferable that the dielectric 26 is formed as thick as possible to restrain the consumption of the dielectric 26. However, a plurality of gas holes 27 of φ0.5 mm need to be formed to penetrate through the dielectric 26, and thus, if the dielectric 26 is too thick, it is difficult to make the gas holes 27 penetrate through the dielectric 26. Also, if the electric potential of the plasma is excessively reduced, the dielectric 26 is not sputtered by the positive ions, and thus, deposit may be accumulated on the surface of the dielectric 26. Therefore, in consideration of processability of the gas holes 27 formed in the dielectric 26 and restraint of the accumulation of deposits on the surface of the dielectric 26, it is preferable that the thickness of the dielectric 26 is 10 mm or less.

Also, as shown in the graph of FIG. 2, since the changing aspect of the electric potential of the plasma varies depending on the frequency of the bias power or the NC ratio, the thickness of the dielectric 26 may be changed to prevent the dielectric 26 from being consumed when the frequency of the bias power or the A/C ratio changes even under the same processing condition.

In the above-described substrate processing apparatus 10, the shower head 22 moves in up and down direction like a piston in the chamber 11; however, the method of setting the thickness of the dielectric of the present embodiment may be also applied to a substrate processing apparatus in which a shower head is fixed and does not move in up and down direction.

The present invention has been described above with reference to the above-described embodiments; however, the present invention is not limited to the above embodiment.

Also, in the embodiment described above, the substrate on which the plasma process is performed is not limited to the wafer for a semiconductor device, and may be any substrate used in a FPD (Flat Panel Display) and the like, including an LCD (Liquid Crystal Display), a photomask, a CD substrate, a print substrate, or the like.

EXAMPLE

An embodiment of the present invention will be described as follows.

In the substrate processing apparatus 10, the thickness of the dielectric 26 was set to be 10 mm. After that, the wafer W was transferred to the chamber 11, and plasma processes including the dry etching process or an ashing process under the following three processing conditions were performed repeatedly on the wafer W for 90 hours.

First processing condition: a pressure in the chamber 11 was 60 mTorr (8.00 Pa), the plasma generating power value was 500 W, the bias power value was 500 W, a flow of $CF_4$ was 140 sccm, and a continuous processing time was 20 seconds.

Second processing condition: a pressure in the chamber 11 was 30 mTorr, the plasma generating power value was 2700 W, the bias power value was 2000 W, a flow rate of a mixture gas was $CHF_3:Ar:O_2 = 100:1000:30$ sccm, and a continuous processing time was 50 seconds.

Third processing condition: a pressure in the chamber 11 was 40 mTorr (5.33 Pa), the plasma generating power value was 2700 W, the bias power value was 3000 W, a flow rate of a mixture gas was $C_4F_6:Ar:O_2 = 30:1100:20$ sccm, and a continuous processing time was 450 seconds.

After that, consumption amounts of the dielectric 26 were measured at points respectively 30 mm, 100 mm, and 150 mm apart from a center of the dielectric 26 in a radial direction. The measured consumption amounts of the dielectric 26 at the points were 0.022 mm, 0.012 mm, and 0.000 mm, respectively, and an average etch rate of the entire surface of the dielectric 26 was 0.25 µm/hour.

In general, the dielectric 26 or the upper electrode 24 is replaced when it is consumed by about 2 mm, and thus, replacement of the dielectric 26 was not necessary for a long operating time of 8000 hours in the example. In addition, since an annual operating time of the substrate processing apparatus 10 is generally about 5000 hours, the replacement of dielectric 26 is not necessary for one year or longer, and thus, the dielectric 26 is not a subject of CoC.

According to the present invention, in a case where the dielectric is not formed on an electrode, the electric potential of plasma facing a dielectric is estimated, and the thickness of the dielectric is determined so that the electric potential of the plasma, which is obtained by multiplying the estimated electric potential of the plasma by a capacity reduction coefficient calculated when the capacity of the dielectric and a capacity of sheath occurring around the surface of the dielectric are combined with each other, is 100 eV or less. In general, when the electric potential of the plasma is 100 eV or less, silicon dioxide is not etched by the plasma. Therefore, when a silicon dioxide film formed on a substrate is etched by the plasma, the consumption of dielectric formed in the electrode may be restrained.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of setting a thickness of a dielectric in a substrate processing apparatus including a processing chamber in which plasma is generated; a holding stage which is disposed in the processing chamber and places a substrate thereon; an electrode facing the holding stage; and the dielectric disposed in the electrode to face the substrate placed on the holding stage, the dielectric being formed of silicon dioxide, and two high frequency powers of different frequencies being applied to the holding stage so as to etch a silicon dioxide film formed on the substrate by using the plasma, the method comprising:

estimating an electric potential of the plasma facing the dielectric in a case where the dielectric is not formed in the electrode, based on the high frequency power value having a lower frequency between the two high frequency powers, and an area ratio of an anode to a cathode in the processing chamber; and setting the thickness of the dielectric so that an electric potential of the plasma, which is obtained by multiplying the estimated electric potential of the plasma by a capacity reduction coefficient calculated when a capacity of the dielectric and a capacity of a sheath generated around a surface of the dielectric are combined, is 100 eV or less.

2. The method of claim 1, wherein when the capacity reduction coefficient is calculated, the sheath and the dielectric are considered as capacitors electrically connected to each other in series.

3. The method of claim 1, wherein when the capacity reduction coefficient is calculated, the thickness of the dielectric is converted into a thickness in a case where a dielectric constant of the dielectric is assumed as a vacuum permittivity.

4. The method of claim 1, wherein when the capacity reduction coefficient is calculated, a thickness of the sheath is calculated based on the estimated electric potential of the plasma.

* * * * *